United States Patent [19]

Franklin

[11] Patent Number: 4,484,213

[45] Date of Patent: Nov. 20, 1984

[54] BINARY WEIGHTED RESISTOR AND PACKAGE

[75] Inventor: Dennis M. Franklin, Jensen Beach, Fla.

[73] Assignee: Solitron Devices, Inc., Port Salerno, Fla.

[21] Appl. No.: 350,209

[22] Filed: Feb. 19, 1982

[51] Int. Cl.³ .............. H01L 27/02; H01L 23/48; H01C 10/00
[52] U.S. Cl. ........................... 357/51; 357/70; 338/195
[58] Field of Search ............ 357/51, 70; 338/195

[56] References Cited

U.S. PATENT DOCUMENTS

| | | | |
|---|---|---|---|
| 3,202,952 | 8/1965 | Rayburn | 338/195 |
| 3,441,804 | 4/1969 | Klemmer | 338/308 X |
| 3,638,162 | 1/1972 | McWade | 338/195 X |
| 4,134,096 | 1/1979 | Denes | 338/195 |
| 4,172,249 | 10/1979 | Szwarc | 338/195 |

FOREIGN PATENT DOCUMENTS 2001478  1/1979  United Kingdom ............ 357/51

Primary Examiner—Andrew J. James
Assistant Examiner—John Lamont

[57] ABSTRACT

A variable circuit configuration in which each of a plurality of series connected devices is connected to a lead frame having a parallel circuit for such connected devices that can control the by-pass or use of all, some or none of the connected devices.

4 Claims, 3 Drawing Figures

BINARY WEIGHTED RESISTOR AND PACKAGE

BACKGROUND

The prior art is replete with teachings of how to form on a substrate a resistor that will have a limited number of areas of differing impedance value related to one another in a binary sequence. Illustrative of these teachings are prior art U.S. Pat. Nos. 4,016,483 and 3,441,804 issued by the United States of America Patent and Trademark Office in 1977 and 1969 respectively.

In this prior art the intent was to provide limited infinite resolution of resistance values for circuits, and for the fine trimming of thin film resistors. In all cases, the prior art has devised such circuits so as to construct on the substrate the means of control of the implementation of the resolution of resistance values in the form of a parallel circuit of fusible links that can be opened by various techniques familiar to those skilled in the art.

SUMMARY

It is the intent of this invention to improve upon this prior art to permit more utilization of the substrate for formation of circuit devices related to each other in a predetermined manner such as, for example, a binary sequence by incorporating a novel lead frame therewith that will not only permit circuit connection but will provide for control of the use of all, some or none of the circuit devices on the substrate when connected.

It is a particular object of this invention to teach those skilled in the art a new structure that will permit the elimination of vast inventories of finite differing circuit devices by the use of the invention hereinafter described in reference to a preferred embodiment.

DRAWING DESCRIPTION

Figure 1:
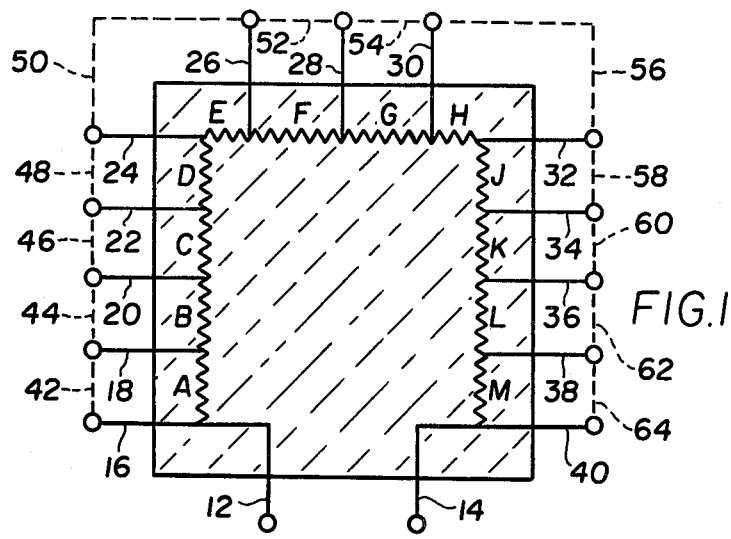
FIG. 1 is a schematic representation of a thin film resistance on a substrate with a lead frame connected thereto so as to provide for use thereof and for control of all, some or none of the various resistive areas of the thin film resistor.

film resistance network having twelve distinct areas A, B, C, D, E, F, G, H, J, K, L and M. A lead frame with an input 12 and an output 14 is connected about the substrate to have connections 16, 18, 20, 22, 24, 26, 28, 30, 32, 34, 36, 38 and 40 connected to each of the distinct areas. In the preferred embodiment a conductive path is provided between these connections by means of structural links 42, 44, 46, 48, 50, 52, 54, 56, 58, 60, 62 and 64. These links, sometimes referred to as shorting links, are typically constructed as tabs that are scribed so as to permit simple breakaway when a portion of the circuit provided by the lead frame is to be opened. This will be more particularly described with reference to FIG. 3 hereinafter.

As will be familiar to those skilled in the art, it is conventional to discuss thin film resistors in terms of sheet resistance, i.e., the resistance measured between terminals 12 and 14 which are molecularly bonded to the entire sides of opposite ends of the thin film resistor. The value of a thin film resistor made of a material with a given sheet resistance will be size related and is usually expressed in ohms per square. As those skilled in the art are aware, such resistors are formed and trimmed, e.g., trimmed by a laser, to create a path of connected squares whose width and length are controlled to provide a predetermined resistive impedance. This invention draws upon such prior art practices in resolving a preferred embodiment for a resistor which, according to this invention has 4096 resistance values defined a binary code comprising twelve (12) bits.

It should be noted at this time that the concept of this invention is available for any number of circuit devices where one has to stock several discrete variations of circuit devices, i.e., attenuators, capacitors, resistors and transistors. The description herein with specific reference to replace the fixed trim resistor inventories is adopted to provide an early disclosure of its utility without awaiting other specific circuit design and construction. It has been found that this invention will allow the user to stock a small number of individual binary selectable resistors, as they are termed in the trade, with the ability to produce resistor values from zero to 1 MEGOHM by selectively removing links 42 through 64 in accordance with a desired resistance value and then obtaining the desired binary code as follows:

TABLE 1

TOTAL OHMIC RANGE VALUE 0,000 OHMS (EXAMPLE)
MOST SIGNIFICANT BIT = R/2 = BIT 1
LEAST SIGNIFICANT BIT = R/4096 = BIT 12

| BIT | 1 | 2 | 3 | 4 | 5 | 6 | 7 | 8 | 9 | 10 | 11 | 12 | |
|---|---|---|---|---|---|---|---|---|---|---|---|---|---|
| WEIGHT | R/2 | R/4 | R/8 | R/16 | R/32 | R/64 | R/128 | R/256 | R/512 | R/1024 | R/2048 | R/4096 | |
| VALUE | 5000 | 2500 | 1250 | 625 | 312.5 | 156.3 | 78.1 | 39 | 19.5 | 9.8 | 4.9 | 2.44 | |
| BINARY CODE EXAMPLE 12 BITS | | | | | | | | | | | | | |
| VALUE | 42 MSB | 44 | 46 | 48 | 50 | 52 | 54 | 56 | 58 | 60 | 62 | 64 LSB | OHMIC VALUE |
| 0 = | 0 | 0 | 0 | 0 | 0 | 0 | 0 | 0 | 0 | 0 | 0 | 0 | = 0 |
| 1 = | 0 | 0 | 0 | 0 | 0 | 0 | 0 | 0 | 0 | 0 | 0 | 1 | = 2.44 |
| 15 = | 0 | 0 | 0 | 0 | 0 | 0 | 0 | 0 | 1 | 1 | 1 | 1 | = 36.6 |
| 16 = | 0 | 0 | 0 | 0 | 0 | 0 | 0 | 1 | 0 | 0 | 0 | 0 | = 39.0 |
| 577 = | 0 | 0 | 1 | 0 | 0 | 1 | 0 | 0 | 0 | 0 | 0 | 1 | = 1409 |
| 2048 = | 1 | 0 | 0 | 0 | 0 | 0 | 0 | 0 | 0 | 0 | 0 | 0 | = 5000 |
| 4095 = | 1 | 1 | 1 | 1 | 1 | 1 | 1 | 1 | 1 | 1 | 1 | 1 | = 9997.5 |

1. BINARY VALUE X OHMIC VALUE OF 1 LSB = SELECTED OHMIC VALUE
2. SELECTED OHMIC VALUE/1 LSB = BINARY VALUE
BINARY "0" = SHORTED
BINARY "1" = OPEN (LINK REMOVED)

DETAILED DESCRIPTION

With more particular reference to FIG. 1 there is shown a substrate 10 on which has been sputtered a thin As may be appreciated this is a very limited sampling from the range of 4096 possibilities. It will be appeciated that in such code selection the links 42 through 64 are removed when a binary "1" is called for.

Figure 2:
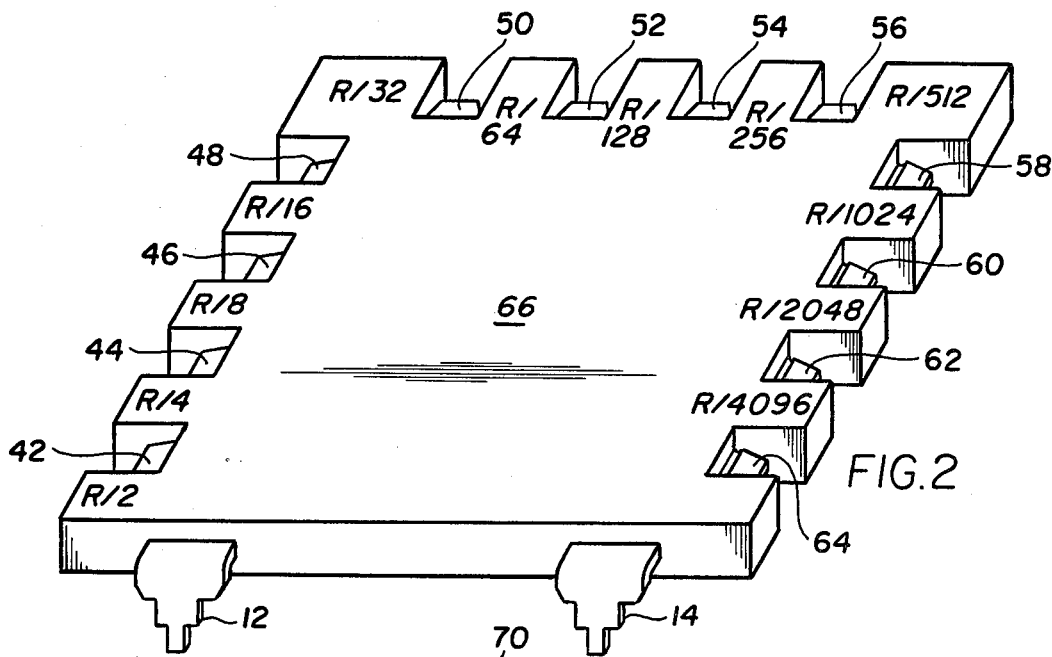
FIG. 2 is a perspective blown-up view of a chip package according to this invention.

With reference now to FIG. 2 and encapsulated chip is shown to comprise an epoxy housing 66 with the binary code for the twelve bit design, i.e., R/2 through R/4096 preceding each tab 42 through 64.

Figure 3:
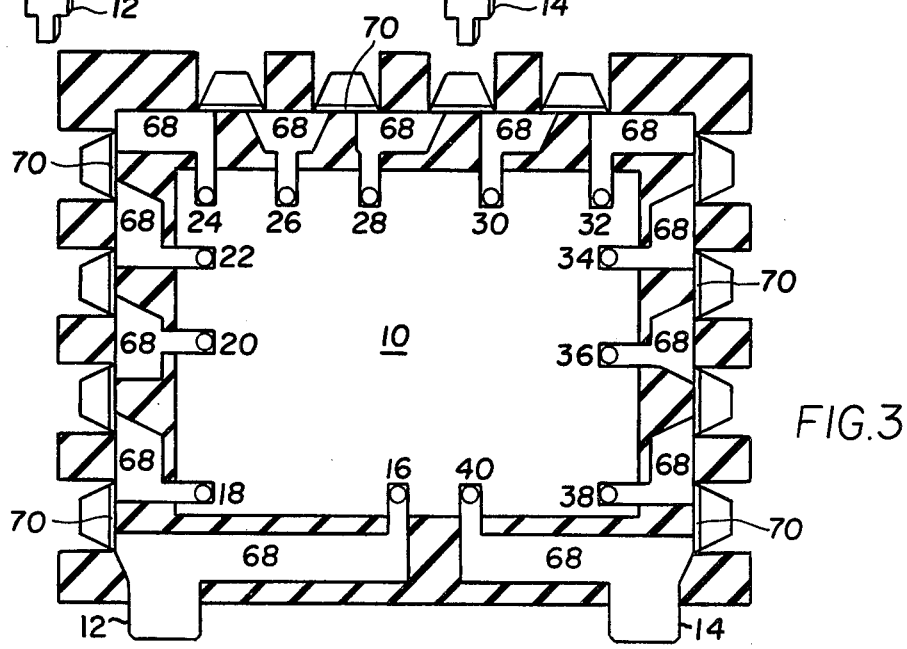
FIG. 3 is a cross-sectional plan view of the chip of FIG. 2.

This construction is opened for viewing by FIG. 3 showing the substrate 10 encircled by a flat lead frame 68 with input/output connections 12 and 14 and resistance connections, as shown. The tabs are scored as at 70 so that they can be simply broken away from the lead frame 68. With such a construction the opening of a path through a particular resistance area is not dependent on the impedance value in protection of the chip as with prior art devices that use fusible link technology on the substrate. Furthermore, the practicality to the user is enhanced by allowing the device to be factory trimmed as regards resistance value and their binary sequence with field selection the resistance combinations for a desired impedance value for the chip in use in the field.

Having described an operative construction for this invention with its advantages it is now desired to set forth the protection sought by these Letters Patent in the appended claims.

I claim:

1. A binary weighted resistance comprising:
   a substrate;
   a thin film resistance formed on said substrate and having an input terminal, an output terminal and a plurality of discrete portions, each portion having a specified impedance such that said specified impedances relate to one another in a binary sequence;
   a lead frame having pin connections for connecting corresponding ones of said plurality of discrete portions such that a first series circuit from said input terminal through said plurality discrete portions to said output terminal is formed;
   shunt links on said lead frame connected between corresponding ones of said pin connections such that a second series circuit from said input terminal to said output terminal is formed parallel to said first series circuit; and
   a plastic housing encapsulating said substrate, said thin film resistance and a portion of said lead frame, such that said input terminal and said output terminal and said shunt links are external to said housing to permit selective removal of said shunt links to interrupt said second series circuit for external control of said binary sequence of said discrete portions.

2. A binary selectable resistor comprising:
   a substrate;
   a thin film resistance formed on said substrate having a predetermined plurality of distinct areas of varied impedance in a binary sequence segregated about the periphery of the substrate;
   a lead frame encircling said substrate including leads to each of said distinct areas,
   an input terminal and an output terminal,
   peripheral shunt links connected so as to form by-passing conductive paths about corresponding ones of said distinct areas and to form a circuit about said periphery of the substrate in parallel with said thin film resistance, said shunt links being severable selectively from said lead frame to provide an impedance value of a desired binary sequence between said input and output terminals; and
   means for encapsulating said substrate, said thin film resistance and a portion of said lead frame, for providing peripheral, protected access to said shunt links of said lead frame and for enabling removal of selected shunt links to modify an impedance value between said input and output terminals after encapsulation and without penetration of the encapsulation.

3. A resistor chip having an impedance variable in accordance with a binary sequence comprising:
   a substrate;
   a resistive element formed on said substrate, said resistive element having selected areas of differing impedance related to each other in accordance with said binary sequence;
   a lead frame including
       leads connected to corresponding ones of said selected areas, and
       shunt links connected between corresponding ones of said leads to provide respective by-pass circuits in parallel with each of said areas, said shunt links being selectively removable to vary said impedance in accordance with said binary sequence; and
   housing means for protecting said substrate, said resistive element and a portion of said lead frame, such that respective portions of said input terminal, of said output terminal and of said lead frame are external to said housing means, and for providing protected, peripheral exposure of said shunt links to enable variation of said impedance of said resistor chip.

4. A chip comprising:
   a substrate;
   a plurality of circuit devices on said substrate related to each other in a predetermined sequence;
   a lead frame positioned about said substrate and including
       an input and an output terminal, each operatively connected to respective ones of said plurality of devices;
       a plurality of connections, each connected to a corresponding one of said plurality of circuit devices;
       peripherally located, severable conductive links, each link operatively connected between corresponding ones of said connections to each of said plurality of circuit devices to shunt said connections and to connect said input and said output terminals; and
   encapsulating means for encapsulating said substrate, said plurality of circuit devices and portions of said lead frame such that portions of said input and output terminals and each of said conductive links are external to said encapsulating means,
   each of said conductive links being removable adjacent the periphery of the encapsulating means to interrupt the shunt between said corresponding ones of said connections, to connect said corresponding circuit device in series with said input and output terminals of said lead frame.

* * * * *